(12) United States Patent
Korevaar et al.

(10) Patent No.: US 7,390,573 B2
(45) Date of Patent: Jun. 24, 2008

(54) PLASMA COATING SYSTEM FOR NON-PLANAR SUBSTRATES

(75) Inventors: Bastian A. Korevaar, Clifton Park, NY (US); Charles D. Iacovangelo, Clifton Park, NY (US); Thomas Miebach, Ballston Spa, NY (US); Michael W. Mercedes, Watervliet, NY (US)

(73) Assignee: Exatec LLC, Wixom, MI (US)

( * ) Notice: Subject to any disclaimer, the term of this patent is extended or adjusted under 35 U.S.C. 154(b) by 325 days.

(21) Appl. No.: 11/075,341

(22) Filed: Mar. 8, 2005

(65) Prior Publication Data

US 2005/0202259 A1    Sep. 15, 2005

Related U.S. Application Data

(60) Provisional application No. 60/551,931, filed on Mar. 9, 2004.

(51) Int. Cl.
*B32B 9/04* (2006.01)
*B05D 5/06* (2006.01)
*C08J 7/18* (2006.01)
*C23C 14/02* (2006.01)

(52) U.S. Cl. .............. 428/447; 427/162; 427/489; 427/569

(58) Field of Classification Search ............... 428/447
See application file for complete search history.

(56) References Cited

U.S. PATENT DOCUMENTS

| | | | |
|---|---|---|---|
| 4,927,704 A | 5/1990 | Reed et al. | |
| 5,156,882 A | 10/1992 | Rzad et al. | |
| 5,679,413 A | 10/1997 | Petrmichl et al. | |
| 6,110,544 A * | 8/2000 | Yang et al. ........... | 427/580 |
| 6,261,694 B1 | 7/2001 | Iacovangelo | |
| 6,365,016 B1 | 4/2002 | Iacovangelo et al. | |
| 6,376,064 B1 | 4/2002 | Gasworth et al. | |
| 6,379,757 B1 | 4/2002 | Iacovangelo | |
| 6,397,776 B1 | 6/2002 | Yang et al. | |
| 6,420,032 B1 | 7/2002 | Iacovangelo | |
| 6,426,125 B1 | 7/2002 | Yang et al. | |
| 6,432,494 B1 | 8/2002 | Yang et al. | |
| 6,517,687 B1 | 2/2003 | Iacovangelo | |
| 6,681,716 B2 | 1/2004 | Schaepkens | |
| 6,872,428 B2 | 3/2005 | Yang et al. | |
| 6,890,656 B2 | 5/2005 | Iacovangelo et al. | |
| 2004/0040833 A1 | 3/2004 | Schaepkens et al. | |

FOREIGN PATENT DOCUMENTS

| | | |
|---|---|---|
| EP | 0 887 437 A2 | 12/1998 |
| WO | WO 00/55388 | 2/2000 |
| WO | WO 00/55389 | 2/2000 |
| WO | WO 00/55654 | 2/2000 |

* cited by examiner

*Primary Examiner*—Randy Gulakowski
*Assistant Examiner*—John J Figueroa
(74) *Attorney, Agent, or Firm*—Brinks Hofer Gilson & Lione (57) ABSTRACT

A non-planar article includes a plasma deposited abrasion resistant coating with a substantially uniform thickness and a substantially uniform abrasion resistance with delta haze (%) in the range between about +/−0.25 of the mean value.

16 Claims, 5 Drawing Sheets

PLASMA COATING SYSTEM FOR NON-PLANAR SUBSTRATES

RELATED APPLICATION

This application claims the benefit of U.S. Provisional Application No. 60/551,931, filed Mar. 9, 2004, the entire contents of which are incorporated herein by reference.

BACKGROUND

The present invention generally relates to an article and process for coating substrates. More specifically, the invention relates to a non-planar article having a plasma deposited abrasion resistant coating and process for plasma coating non-planar plastic substrates.

A variety of techniques exist for coating substrates with functional coatings. Traditionally chemical vapor deposition (CVD), and physical vapor deposition techniques such as sputtering and evaporation, have been used. These techniques, however, require high deposition temperatures, which limit the substrates that can be coated, and further involve very slow deposition rates. More recently, plasma enhanced chemical vapor deposition (PECVD) processes have been developed to overcome some of these limitations. PECVD can be used to deposit materials on plastic substrates such as polycarbonates, at temperatures lower than the glass transition temperature of the plastic, which was generally not feasible with CVD. In PECVD, the applied electric field enhances the formation of the ionized species, providing a much higher percentage of ionized species that permits the use of low deposition temperatures, e.g. as low as room temperature. However, PECVD still does not generally provide a deposition rate that is high enough to be commercially viable for many applications involving polycarbonates coated with UV absorbing and abrasion resistant layers. In addition, PECVD has not been demonstrated on large complex shapes, but rather has been restricted to planar substrates or non-planar substrates with mild curvature such as ophthalmic lenses.

In attempts to produce coatings with uniform properties on plastic non-planar substrates, some systems move the plasma source relative to the substrate and/or change the process parameters as the substrate translates past the plasma source. While these processes have been shown to produce coating of uniform thickness, they do not provide coatings of uniform abrasion resistance and adhesion. These processes also suffer from being cumbersome, expensive, and require different process parameters for each part design. It is also critical for many applications such as automotive windows where the coated substrate is exposed to outdoor weathering that the coating maintains uniform abrasion resistance upon long-term exposure to UV radiation. It appears, however, that many plasma deposited organosilicon coatings degrade upon exposure to UV resulting in poor abrasion resistance.

SUMMARY

In general, the present invention is directed to a non-planar article having a plasma-deposited abrasion resistant coating with a substantially uniform thickness and a substantially uniform abrasion resistance with delta haze (%) in the range between about +/−0.25 of the mean value.

The invention is further directed to a process for coating non-planar substrates. The process includes generating plasma from one or more stationary expanding thermal plasma (ETP) sources, injecting a first set of vaporized reagents into the plasma to form a first layer on the substrate, and injecting a second set of vaporized reagents into the plasma to form two or more coating layers over the first layer. The ion flux of the plasma is adjusted to give substantially uniform properties over a range of working distances (WD) from the plasma source to the substrate. The working distance is defined as the distance between the anode and the substrate.

Embodiments of the invention may provide one or more of the following advantages. In some implementations, there is no need to change the process parameters during the coating process or for each part if the parts have different shapes. There is also no need for articulating the plasma sources during the coating process, in particular, when the substrate is being translated past the plasma sources in a continuous manner, which makes the set-up of the process less expensive. Various implementations of the invention also enable coating of surfaces of the substrate not directly facing the ETP source.

Further features and advantages of this invention will become readily apparent from the following description, and from the claims.

DETAILED DESCRIPTION

Figure 1:
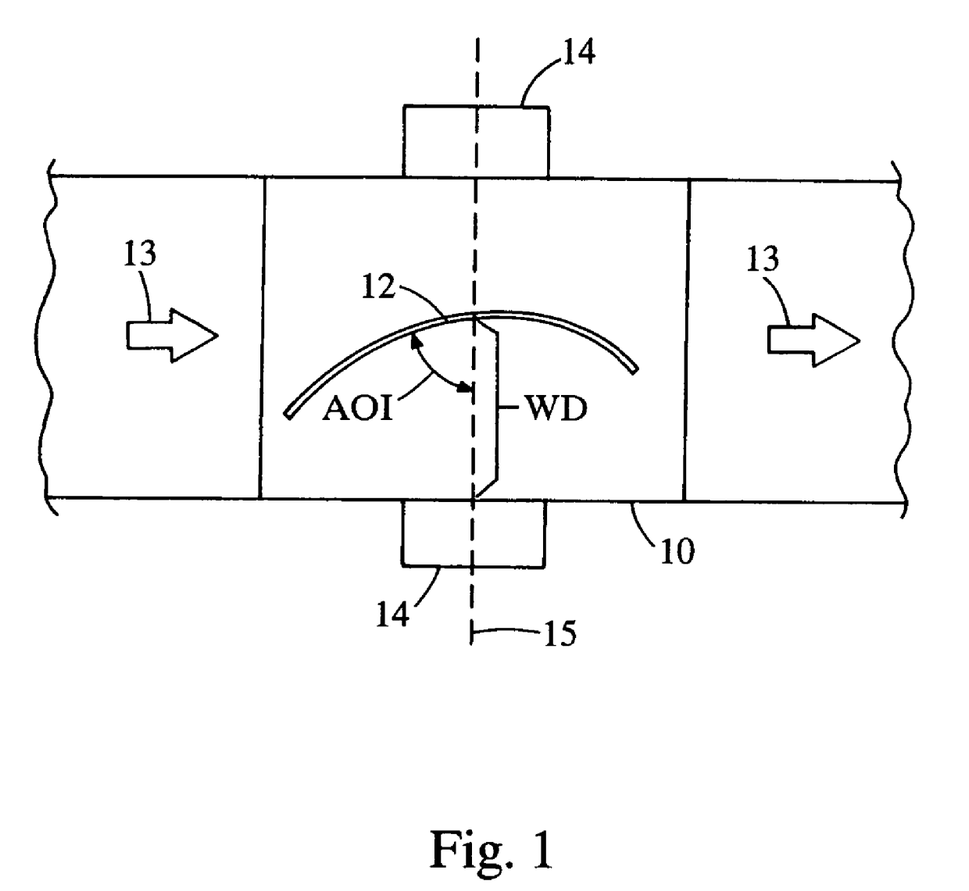
FIG. 1 is a top view of a coating station with expanding thermal plasma sources.

Referring now to FIG. 1, there is shown a coating station 10 in which a substrate 12 follows a fixed linear path through the coating station, as indicated by the arrows 13. The substrate 12 may be a component for an automotive vehicle. For example, the substrate may be a rear window or roof panel made of plastic. The substrate 12 may include a polycarbonate.

Polycarbonates suitable for forming the substrate 12 generally include repeating units of the formula:

where R is a divalent aromatic radical of a dihydric phenol (e.g., a radical of 2,2-bis(4-hydroxyphenyl)-propane, also known as bisphenol A) employed in the polymer producing reaction; or an organic polycarboxylic acid (e.g. terphthalic acid, isophthalic acid, hexahydrophthalic acid, adipic acid, sebacic acid, dodecanedioic acid, and the like). These polycarbonate resins are aromatic carbonate polymers that may be prepared by reacting one or more dihydric phenols with a carbonate precursor such as phosgene, a haloformate or a carbonate ester. One example of a polycarbonate which can be used is LEXAN®, manufactured by the General Electric Company (GE) in Fairfield, Conn.

Aromatic carbonate polymers may be prepared by methods as described, for example, in U.S. Pat. Nos. 3,161,615; 3,220,973; 3,312,659; 3,312,660; 3,313,777; 3,666,614; 3,989,672;

4,200,681; 4,842,941; and 4,210,699, all of which are incorporated herein by reference in their entirety.

The substrate 12 may also include a polyestercarbonate that can be prepared by reacting a carbonate precursor, a dihydric phenol, and a dicarboxylic acid or ester-forming derivative thereof. Polyestercarbonates are described, for example, in U.S. Pat. Nos. 4,454,275; 5,510,448; 4,194,038; and 5,463,013, which are incorporated herein by reference in their entirety.

The substrate may also include a thermoplastic or thermo set material. Examples of suitable thermoplastic materials include polyethylene, polypropylene, polystyrene, polyvinyl acetate, polyvinyl alcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermo set materials include epoxy and urea melamine.

Acrylic polymers are another material from which the substrate 12 may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate 12. Polyesters may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials that can be used to form the substrate. Polyurethanes are well known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate 12 may be formed include acrylonitrile-butadiene-styrene, glass, VALOX® (polybutylenephthalate, available from General Electric Co.), XENOY® (a blend of LEXAN® and VALOX®, available from General Electric Co.), and the like.

The substrate 12 can be formed in a conventional manner, for example by injection molding, extrusion, cold forming, vacuum forming, blow molding, compression molding, transfer molding, thermal forming, and the like. The article may be in any shape and need not be a finished article of commerce, that is, it may be sheet material or film, which is cut or sized or mechanically shaped into a finished article. The substrate may be transparent or not transparent. The substrate may be rigid or flexible. The substrate may also contain other functional coatings. For example, the substrate may contain a silicone hardcoat and primer whose function is to provide adhesion, UV filtering, and some abrasion resistance. Examples of organosilicon compositions which can be employed as hardcoats are compounds represented by the general formula:

$$R^1_n SiZ_{(4-n)}$$

wherein $R^1$ represents a monovalent hydrocarbon radical or a halogenated monovalent hydrocarbon radical, Z represents a hydrolyzable group, and n may vary between 0 and 2. More specifically, Z is typically a member such as halogen, alkoxy, acyloxy, or aryloxy. Such compounds are described, for example, in U.S. Pat. No. 4,224,378 to Schroeter et al., the entire contents of which are incorporated herein by reference.

Other examples of organosilicons which may be employed include silanols having the formula:

$$R^2 Si(OH)_3$$

wherein $R^2$ is selected from the group including alkyl radicals containing from about 1 to about 3 carbon atoms, the vinyl radical, the 3,3,3-trifluoropropyl radical, the gamma-glycidoxypropyl radical and the gamma-methacryloxypropyl radical, with at least about 70% by weight of the silanol being $CH_3Si(OH)_3$. Such compounds are described in U.S. Pat. No. 4,242,381, which is incorporated herein by reference in its entirety.

Other functional coatings include inorganic UV filters, moisture and oxygen barriers, infrared (IR) reflecting coatings, anti-reflecting (AR) coatings, transparent conducting oxide coatings (TCOs), planarization layers, defrosters, black out inks, and the like. Typical UV filters include ZnO, ZnS, $TiO_2$, $CeO_2$, $SnO_2$ and combinations of these materials. They could also be doped with for example, Al, In, F, B, and N to improve the UV absorbency, water immersion stability, and electrical conductivity. Typical moisture and oxygen barriers include $SiO_2$, $Si_3N_4$, $TiO_2$, $Al_2O_3$, AlN, and combinations of these materials. Typical IR reflecting coatings include multilayer stacks of high and low refractive index dielectric materials such as $SiO_2$, $Si_3N_4$, $TiO_2$, ZnO and the like. Another IR reflecting coating includes multilayer stacks of these dielectric materials and metals such as Al, and Ag. Examples of TCOs include aluminum-doped ZnO (AZO), indium-doped ZnO (IZO) indium tin oxide (ITO) and the like.

The substrate can be washed if desired, e.g. with a variety of aqueous soaps and cleaners and or solvents such as isopropyl alcohol, and optionally vacuum dried at about 80° C. overnight before plasma deposition. The substrate can also be cleaned in situ with a plasma pretreatment cleaning step (also referred to as "etching") in which the plasma is generated with argon or with argon and oxygen to remove or oxidize contaminants on the surface of the substrate prior to deposition.

The coating station 10 includes an array of ETP sources 14 on opposite sides of the coating station 10, as well as associated reagent manifolds and oxygen manifolds. The distance between the arrays of ETP sources 14 and the surface of the substrate 12 measured along a plane of symmetry 15 (or a line of symmetry for a pair of ETP sources positioned on opposite sides of the coating station 10) defines a working distance (WD), and the angle between the plane of symmetry 15 and the local surface of the substrate is defined as an angle of incidence (AOI). The coating station 10 may be associated with one or more heaters located upstream of the coating station to heat the substrate before it enters the coating station. Additional coating stations may be located downstream of coating station 10 to provide further plasma coating capabilities, in which case additional heaters may be located between the stations.

During the operation of the coating station 10, the ETP sources 14 are typically fed with an inert gas, such as argon. A voltage is applied to the cathode of the ETP source partially ionizing the argon that issues into a vacuum chamber as plasma jets (from the respective sources) directed towards the substrate 12.

The amount of argon that is ionized can be measured by a Langmuir probe and is referred to hereafter as the total ion flux measured in amperes (A). The use of Langmuir probes to measure the ion flux from a plasma source are described in, for example, "Principles of plasma discharges and materials process" by Lieberman and Lightenberg, Wilely Interscience (1994), and "Electrical Probes for Plasma Diagnostics", by Swift, American Elsevier (1969).

As described below, a commercial probe such as Smart-Probe™ from Scientific Systems, Ltd was used. This was an automated Langmuir probe system including an auto linear drive, which provided spatially or time resolved measurements of a wide range of plasma parameters. The probe was positioned perpendicular to the arc on a linear drive capable of scanning across the plasma jet. The ion flux was measured at about 25 cm from the plasma source i.e. at the same position of the mean WD. The active part of the Langmuir probe is a piece of tungsten wire that is inserted into the plasma and DC biased to draw current from the plasma. Varying the voltage of the probe tip (bias voltage) and measuring the current drawn from the plasma yields a characteristic current-voltage (I-V) curve. From this I-V curve different plasma parameters can be derived. The key measurement parameter gained from the I-V curve that is used for the subsequent calculations is the uncorrected ion flux Pi measured in mA/cm². To characterize an arc, the uncorrected ion flux is measured as a function of radial distance across the expanding plasma at a given WD. The data obtained is fitted to a Gaussian distribution and from the area under the curve ($A_r$) and width ($w_r$) obtained from this fit the total ion flux can be calculated as $$\text{Total Ion Flux} = A_r w_r \sqrt{\frac{\pi}{2}}.$$

The total ion flux represents the number of argon ions and electrons passing through this infinite plane at the given WD and will be expressed in unit of Amperes [A]. This total ion flux together with the width of this Gaussian distribution will be used to describe and compare the expanding thermal plasma process conditions.

Coating reagents and oxygen are injected in vapor form by orifices distributed on the respective manifolds into the chamber. Examples of materials that can be injected into the plasma to form the adhesion and abrasion resistant layers include organosilicons, as well as hydrocarbons such as ethyl benzene and straight chain hydrocarbons such as butane. "Organosilicon" as used herein is meant to encompass organic compounds in which at least one silicon atom is bonded to at least one carbon atom, and includes silicone materials, as well as materials commonly referred to as silanes, siloxanes, silazanes, and organosilicones. Many of the organosilicons suitable for the method and article of the present invention are described in Organic Polymer Chemistry, K. Saunders, Chapman and Hall Ltd., 1973, the entire contents of which are incorporated herein by reference.

Examples of organosilicon precursors for forming adhesion layers and/or abrasion layers include octamethylcyclotetrasiloxane (D4), decamethylcyclopentasiloxane (D5), tetramethyltetravinylcyclotetrasiloxane (V-D4), tetramethyldisiloxane (TMDSO), dimethyldimethoxysilane (DMDMS) and hexamethyldisiloxane (HMDSO) and vinyltrimethylsilane (VTMS).

Examples of functional coatings and associated precursors that can be injected into the plasma include: inorganic UV filters from dimethylzinc (DMZ), diethylzinc (DEZ), zinc vapor, titanium tetrachloride, titanium-alkoxides, cerium alkoxides and diketonates; dopants and dielectrics from trimethylaluminum, triethylaluminum, aluminum alkoxides, aluminum vapor, trimethylindium, triethylindium, indium diketonates; TCOs from vinyltrimethylsilane (VTMS), silane, tin alkoxides and diketonates. Useful oxidants include oxygen, water, ammonia, hydrogen sulfide, hexamethyldisilthiane, fluoride, $CF_4$, and $NF_3$.

To improve the abrasion resistance of a non-planar, three-dimensional part, it is desirable to coat all areas of the surface of the substrate with a sufficient amount of an abrasion resistant material. The abrasion resistance and the coating thickness are each related to the ion flux. In addition, the ion density in the plasma is typically in the shape of a Gaussian distribution, the width of which is dependent upon the pressure in the chamber. Therefore, all these factors are must be considered to obtain a coating with the proper thickness and coating properties to provide sufficient abrasion resistance. This can be achieved in the coating station 10 with the ETP sources 14. If the flow rate of oxygen and the ion flux of the ETP sources 14 are sufficiently high, and the proper spacing between ETP sources is employed the coating station 10 is able to produce coatings of uniform properties for both wide ranges of working distance and angle without the need to change the process parameters. Since abrasion resistance is difficult to measure on non-planar 3D surface with well-accepted methods such as ASTM D1044 Taber abrasion test, abrasion resistance was measured on flat sheets placed at various angles to the plasma source such that different points along the substrate are at a different working distance from the ETP source. This combination of angled parts and different working distance can then be used to represent non-planar 3D shapes.

The coating station 10 first deposits a first $SiO_xC_yH_z$ layer, which adheres well to the substrate 12 and the subsequent abrasion layers. Then, the coating station 10 or another similar station deposits a second layer of $SiO_xC_yH_z$ to provide a topcoat of desired hardness and thickness to achieve uniform abrasion resistance.

Typically the oxygen content of the first layer is lower than that of the second. The abrasion resistance test imparts both scratch and impact damage. Thus, even though harder topcoats result in better scratch resistance, the topcoats have an adequate thickness to avoid fracture due to impact. Accordingly, the system 10 deposits coatings with sufficient hardness and thickness to achieve a tough coating with the desired abrasion resistance.

Furthermore, if either the adhesion layer or the topcoat is too thick, the adhesion between the two layers may be compromised because of the strain induced at the interface between layers. Adhesion issues might also arise if the deposition temperature is too low or too high.

In a particular implementation, the coating station 10 or a pair of coating stations 10 first deposits an adhesion layer with a thickness of about 1 micron and then deposits an abrasion resistant layer with a thickness in the range between about 1 and 3 microns.

Various features of the invention are illustrated by the following examples, which are not to be construed as limitations on the scope of the invention.

EXAMPLE 1

Figure 2:
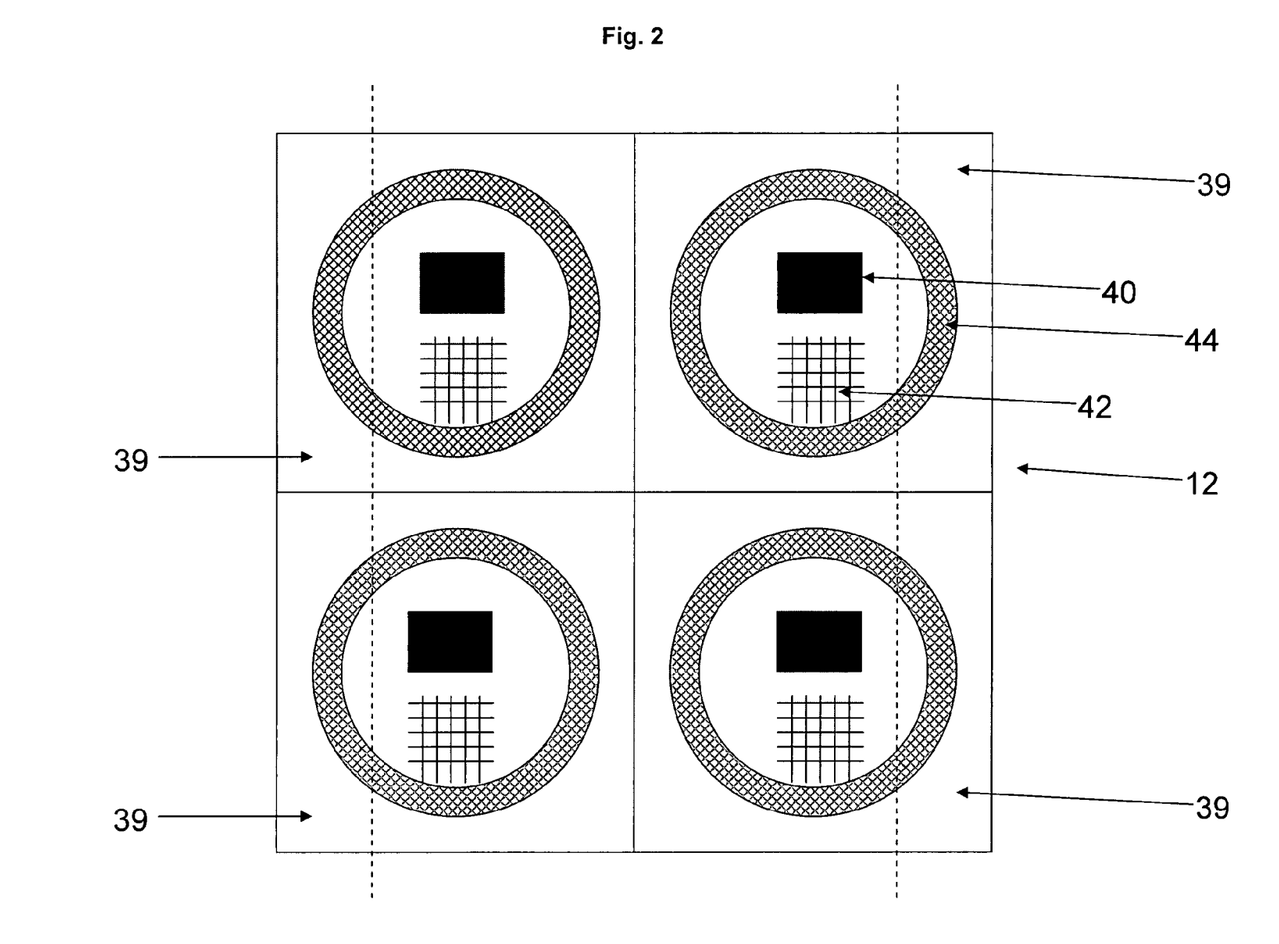
FIG. 2 is a front view of a substrate setup.

In this example, Lexan® MR10 sheets from General Electric were coated with plasma polymerized and oxidized D4. In the coating process, two stationary ETP sources 14 were arranged with their centerlines parallel and spaced approximately 16 cm apart. This configuration was used to coat approximately 64 in² of substrate. Four 4 inch×4 inch samples 39 were mounted on an aluminum holder, as shown in FIG. 2. The samples were designated 1T (top right), 1B (bottom right), 2T (top left) and 2B (bottom left). The substrate was translated vertically past the ETP sources 14 at a scan speed of about 2.3 cm/sec. The rectangles 40 indicate typical positions of silicon chips. The coating thickness on these chips was measured by ellipsometry. Silicon chips were placed every 1-inch along the substrates in both a vertical and horizontal straight line during experiments where coating thickness profiles were generated. The cross hatches 42 are at the locations where the coating adhesion was measured before and after a 3-day immersion in 65° C. water. The rings 44 indicate the tracks of the Taber wheels after the ASTM D1044 abrasion test. The Taber abrasion test was conducted with CS10F wheels and 1000 cycles. The delta haze was measured in ring 44 in four locations at 90 degree angles. The vertical dashed lines indicate the path of the centerlines of the respective ETP sources 14, as the substrate is translated.

Each of the four 4 inch×4 inch samples 39 were preheated to approximately 118° C. prior to deposition as shown in Table 1. The temperatures of each sample during preheat and the coating process were monitored with a type K thermocouple. The coating was applied in two steps. For the first layer, the plasma conditions were: 1.65 standard liters per minute (slm) argon, 0.3 slm oxygen, 0.19 slm D4, and 70 A, resulting in an ion flux of 41.7 A. For the second layer, the conditions were the same except the oxygen flow was increased to 1.0 slm. The WD was about 25.5 cm. The time between coatings was about 1 minute, which made the deposition temperature of both layers essentially the same. Three runs at these conditions were made identified as Examples 1a, 1b, and 1c in table 1.

Shown in Table 1 are the Example number, the sample location, the WD, argon flow to each ETP source, first and second layer designation, preheat temp measured at three locations across the substrate, oxygen flow to each ETP source, the D4 flow to each ETP source, the current to both ETP sources, the average initial temperature (pre-heat temperature), the maximum temperature during coating, the change in temperature (ΔT) during the coating process, the thickness of the coating, the change in haze during Taber abrasion testing (ASTM D1044), the initial adhesion, and the adhesion after three days immersion in 65° C. water as measured by an ASTM D3359 cross hatch tape test. Again, the locations of the Taber abrasion wheel track and water immersion crosshatches on the substrates are shown in FIG. 2. The lower delta haze measured in taber abrasion testing corresponds to greater abrasion resistance. For automotive glazing the National Transportation Highway Traffic Administration (NHTSA) standard is less than 2%. Taber delta haze. All samples had a coating thickness of about 2.1 microns, a Taber delta haze of about 1.7%, with 5B adhesion before and 4B after water immersion.

EXAMPLE 2

The process conditions were similar to those of Example 1 except the WD was increased to 31 cm. The final coating thickness was 2.1 microns, the same as example 1, but the mean Taber delta haze increased to about 3% and about 4% for the two runs. Thus, obtaining a desired coating thickness does not necessarily ensure a coating with good abrasion resistance, especially for coatings produced at larger WD. Hence, non-planar parts with WDs that exceed a threshold WD may not have uniform abrasion resistance, even though the coating thickness may be uniform.

EXAMPLE 3

Figure 3:
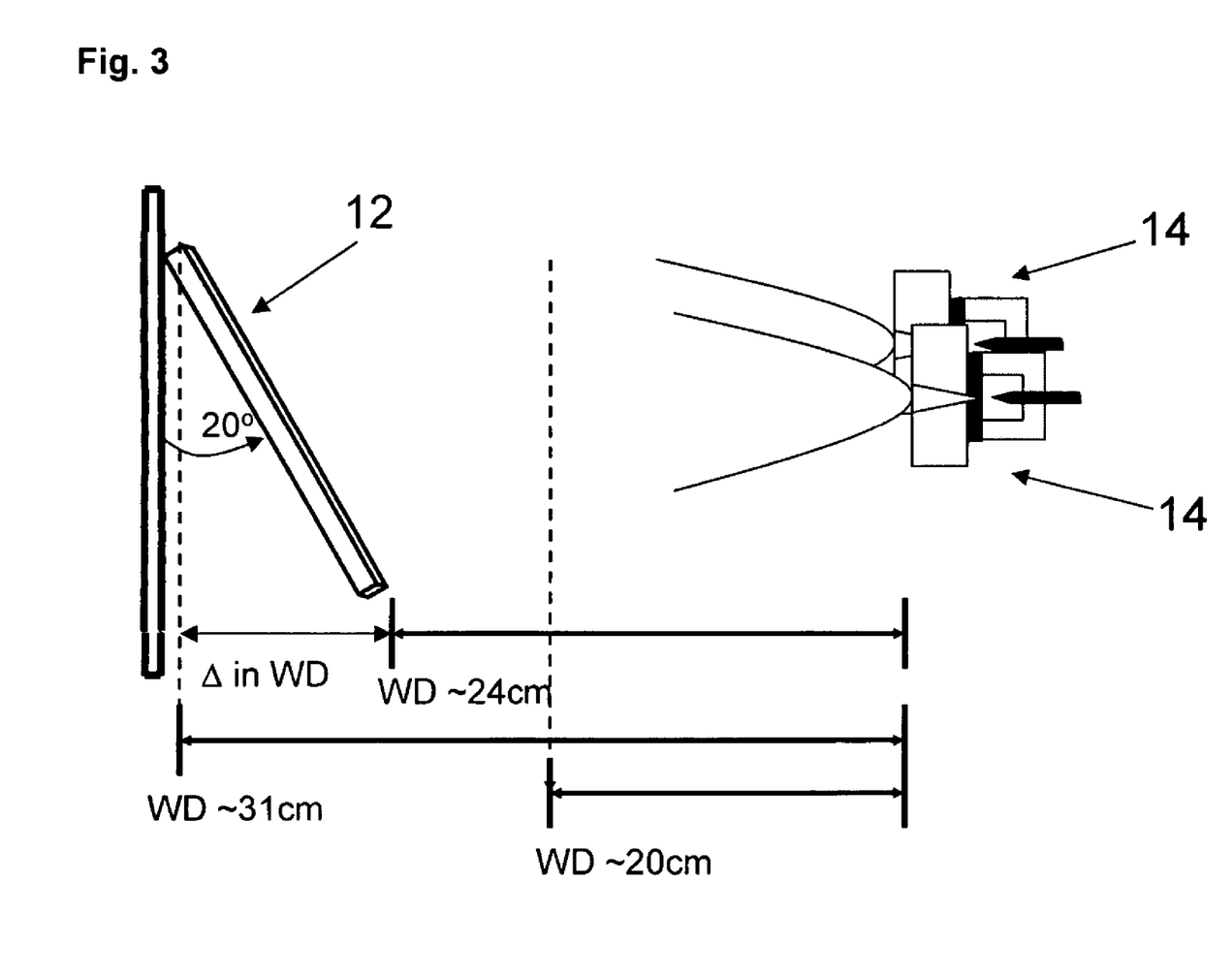
FIG. 3 is a side view of two substrates at the same angle of incidence.

Process conditions were similar to those of Example 1, except the substrate holder was angled at about 20° (as shown in FIG. 3) such that the WD at the top of the substrate was 31 cm and at the bottom was 24 cm. A uniform coating thickness of about 2.1 microns was obtained, but the Taber delta haze increased from about 4% at the bottom (i.e., the shorter working distance) to 10% at the top. Thus, comparing Examples 1 through 3 shows that both flat or angled parts coated with these process conditions have poor Taber at relatively long working distances.

EXAMPLE 4

Process conditions were similar to those of Example 2, but four layers were deposited on the substrate with a total coating thickness of about 4 microns. The conditions for layers 2 through 4 were the same as layer 2 of Example 2. Thus, only the coating thickness changed while the composition of the abrasion resistant layers remained identical. The Taber delta haze was 2.4%-3.1%. Thus, increasing the thickness alone did not result in a Taber delta haze of less than 2%.

EXAMPLE 5

In this example, the argon flow was increased to 2.5 slm for abrasion layers 2-4, which increased the ion flux to 52.5 A. The preheat temperature was decreased to about 75° C., and the oxygen flow rate during the second through fourth layer was 2 slm. The other conditions were the same as in Example 4. Three different runs were performed with WD of 31, 20 and 25 cm for three different samples, respectively. The resulting coating thicknesses were similar to that of Example 4; 4.5, 4.7, and 5.4 microns, respectively. The Taber delta haze improved to 1.2%, 1.1%, and 1.2%, respectively.

EXAMPLE 6

Figure 4A:
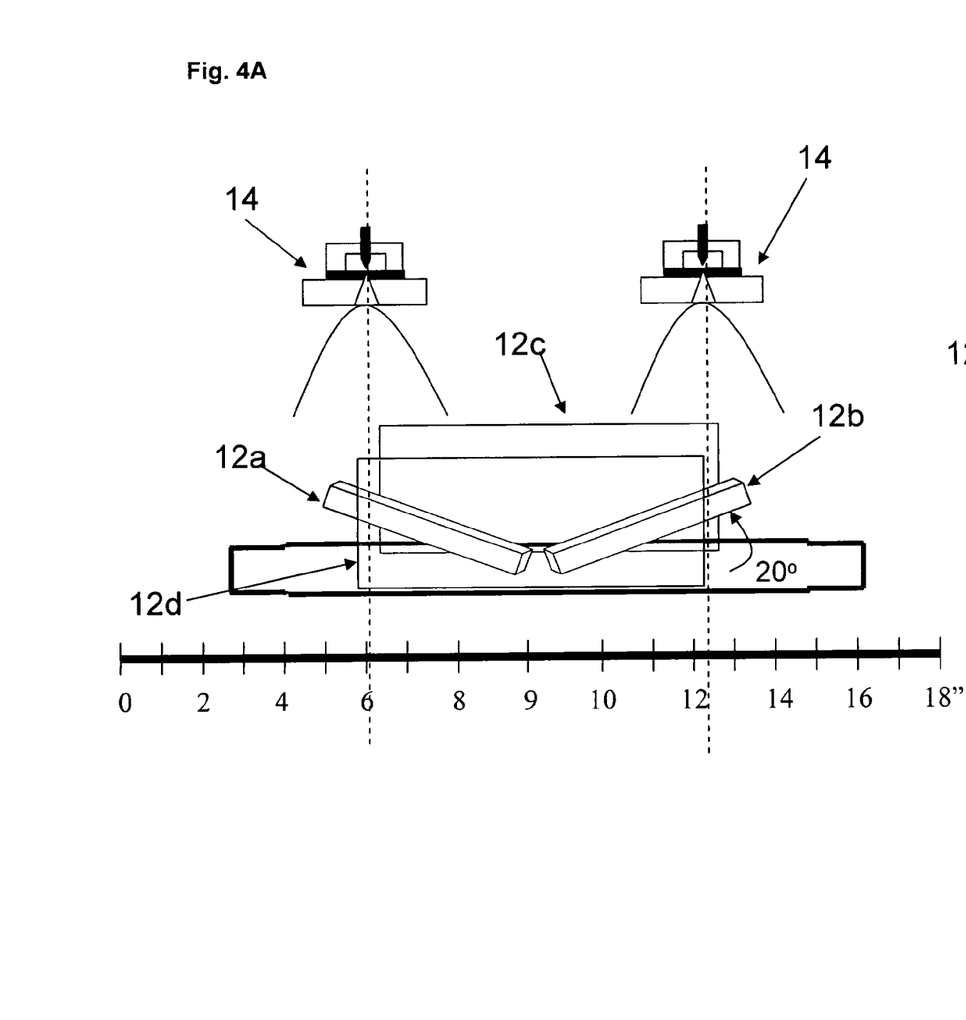
FIG. 4A is a top view of four substrates mounted at two different angles of incidence.
Figure 4B:
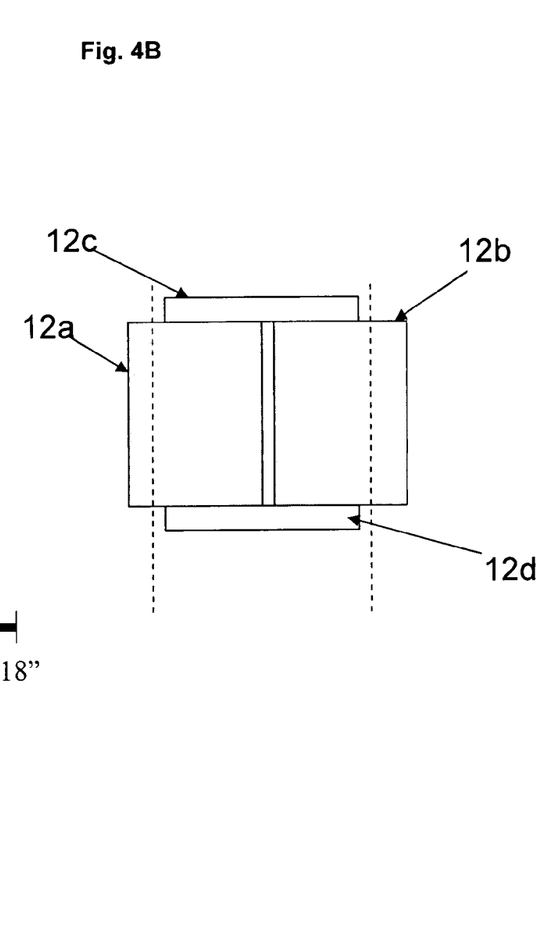
FIG. 4B is a front view of the four substrates of FIG. 4A.

Process conditions were similar to those of Example 5. The arrangement of the substrates is shown in FIG. 4. There are six angled substrates or samples 12aT, 12aB, 12bT, 12bB, 12c, and 12d. Four substrates 12aT, 12aB, 12bT, 12bB are angled at 200 and have a WD of 24 to 31 cm. The other two substrates 12c, 12d are standing on either side of the substrates 12aT, 12aB, 12bT, 12bB. Substrates 12c, 12d are 4 inch×6 inch and parallel to the ETP centerline with a WD of 21 to 31 cm. In FIG. 4A, the setup is viewed along the direction of translation, thus the scanning direction is in and out of the page. In FIG. 4B shows the substrate as viewed from the ETP sources, with the scanning direction up and down. For the substrates 12aT, 12aB, 12bT, 12bB angled at 20 degrees, the coating thickness was between about 4.6 and 4.9 microns and the Taber abrasion was between about 1.4% and 2.0%. The two substrates 12c and 12d, parallel to the ETP centerline, had an average thickness and Taber of about 2.8 um and 2.5%, respectively, on the front (i.e., the sides facing in towards the substrates 12aT, 12aB, 12bT, 12bB) and about 3.1 um and 3.5%, respectively, on the back (i.e., the sides facing away from the substrates 12aT, 12aB, 12bT, 12bB).

EXAMPLE 7

Figure 5:
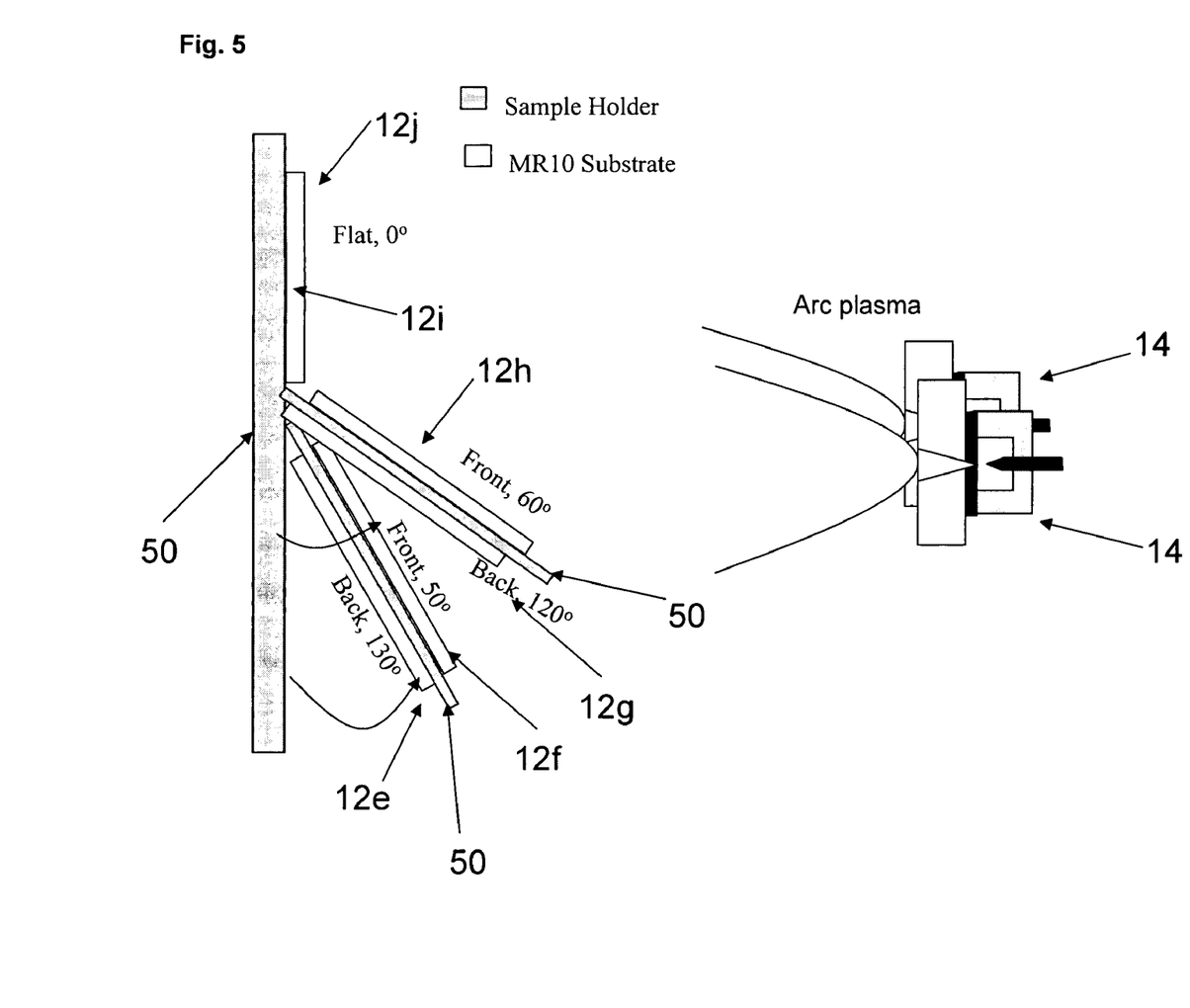
FIG. 5 is a side view of six substrates mounted at different angles relative to expanding thermal plasma sources.

Process conditions were similar to those of Example 6. As shown in FIG. 5, six 4 inch×4 inch samples or substrates 12e, 12f, 12g, 12h, 12i, and 12j were mounted at various angles and on the front and back sides on a sample holder 50. The two substrates 12f, 12h with angles of 50° and 60°, relative to the substrate holder, respectively, are labeled as being on the "Front", and are facing the ETPs 14. The two substrates 12g, 12e with angles of incidence of 120° and 130°, respectively, are labeled as being on the "Back", and are facing away from the plasma. The two substrates 12i, 12j are lying flat at the base of each of the front-side samples 12h, 12f, respectively. The WD for substrates 12e-12j ranged from 19.8 cm to 27.8 cm. Note that the scanning direction was up and down, and the experiment was performed twice.

The average thickness for the flat substrates 12i, 12j, the front-side substrates 12f, 12h, and the backside substrates 12e, 12g was 4.8 μm, 4.7 μm, and 3.9 μm, respectively. The average Taber delta haze for the flat substrates 12i, 12j, the front-side substrates 12f, 12h, and the backside substrates 12e, 12g was 2.2%, 2.1%, and 7.9%, respectively. Thus, with these processing conditions, excellent Taber abrasion was obtained over a large ranges of WD and angle of incidence, and even the backside substrates 12e, 12g had good abrasion resistance.

EXAMPLE 8

For this case, the coating conditions of Example 1 were used to coat a LEXAN® MR7 sheet manufactured by General Electric and quartz slides with about 2 microns of D4. The abrasion resistance before UV exposure of the plasma coated MR7 was <2%. The UV absorbency, defined as the absorbance divided by the thickness in microns, of the coating was 0.012 micrometer$^{-1}$ at 300 nm (UVB) and 0.007 micrometer$^{-1}$ at 350 nm (UVA) measured on the quartz slide. The coating was subjected to QUVA and QUVB accelerated weathering. The Taber abrasion was measured about every 1000 hours. No degradation in performance was observed after 4000 hrs of QUVB and 2500 hours of QUVA testing.

EXAMPLE 9

In this example, the conditions of Example 8 were used except the organosilicon was TMDSO. The coating thickness was about 1.5 microns and the initial Taber abrasion was about 4%. The coating absorbance was 0.057 at 300 nm and 0.031 at 350 nm. The abrasion resistance after exposure to QUVB was about 6%, 7%, 9% and 17% at 1000, 2000, 4000 and 5000 hrs, respectively.

EXAMPLE 10

For this example, a substrate coated with TMDSO applied in a traditional PECVD reactor was evaluated. The coating thickness was about 4 microns and the initial Taber abrasion was about 2%. The coating absorbance was 0.37 at 300 nm and 0.1 at 350 nm. The abrasion resistance after exposure to QUVB was about 12% and 20%, at 1000 and 2000 hrs, respectively. After 2550 hrs of QUVA testing the abrasion resistance had deteriorated to 12%.

Comparing Examples 8 through 10 demonstrates that the degradation of the Taber abrasion resistance of the coating in weathering is related to the UV absorbance of the coating. They further demonstrate that this property of the coating is related not only to the coating precursor deposited, but also to the process for depositing the material. Finally, Example 8 demonstrates that coatings with long term stability to accelerated weathering can be deposited with the ETP process in accordance with this invention.

Other embodiments are within the scope of the following claims.

TABLE 1

| ex # | Pos | working distance (cm) | Ar(slm) arc1 | Ar(slm) arc2 | ABL | PH Setpoint (°C) A | PH Setpoint (°C) B | PH Setpoint (°C) C | O$_2$(slm) arc1 | O$_2$(slm) arc2 | D4(slm) arc1 | D4(slm) arc2 | Current amps | T$_{initial}$ (°C) Avg. | T$_{max}$ (°C) | ΔT (°C) | Thickness (μm) | Haze ΔTaber (%) | Initial Adhesion | WS Adhesion |
|---|---|---|---|---|---|---|---|---|---|---|---|---|---|---|---|---|---|---|---|---|
| 1a | 1T | 25.5 | 1.65 | 1.65 | 1 | 119 | 114 | 119 | 0.3 | 0.3 | 0.19 | 0.19 | 70 | 117 | 154 | 37 | 2.0 | 1.8 | 5 | 4.0 |
|  | 1B |  | 1.65 | 1.65 | 2 | 119 | 114 | 119 | 1 | 1 | 0.19 | 0.19 | 70 | 117 | 155 | 38 | 2.1 | 2.2 | 5 | 5.0 |
|  | 2T |  | 1.65 | 1.65 | 1 |  |  |  |  |  |  |  |  |  |  |  | 2.1 | 1.4 | 5 | 5.0 |
|  | 2B |  | 1.65 | 1.65 | 2 |  |  |  |  |  |  |  |  |  |  |  | 2.2 | 2.1 | 5 | 4.0 |
| 1b | 1T | 25.5 | 1.65 | 1.65 | 1 | 119 | 114 | 120 | 0.3 | 0.3 | 0.19 | 0.19 | 70 | 118 | 152 | 34 | 2.1 | 1.7 | 5 | 4.0 |
|  | 1B |  | 1.65 | 1.65 | 2 | 117 | 111 | 115 | 1 | 1 | 0.19 | 0.19 | 70 | 114 | 153 | 39 | 2.1 | 2.1 | 5 | 4.0 |
|  | 2T |  | 1.65 | 1.65 | 1 |  |  |  |  |  |  |  |  |  |  |  | 2.1 | 1.9 | 5 | 4.0 |
|  | 2B |  | 1.65 | 1.65 | 2 |  |  |  |  |  |  |  |  |  |  |  | 2.2 | 2.0 | 5 | 5.0 |
| 1c | 1T | 25.5 | 1.65 | 1.65 | 1 | 119 | 114 | 120 | 0.3 | 0.3 | 0.19 | 0.19 | 70 | 118 | 152 | 34 | 2.1 | 1.5 | 5 | 4.0 |
|  | 1B |  | 1.65 | 1.65 | 2 | 116 | 110 | 114 | 1 | 1 | 0.19 | 0.19 | 70 | 113 | 156 | 43 | 2.2 | 1.5 | 5 | 4.0 |
|  | 2T |  | 1.65 | 1.65 | 1 |  |  |  |  |  |  |  |  |  |  |  | 2.2 | 1.3 | 5 | 5.0 |
|  | 2B |  | 1.65 | 1.65 | 2 |  |  |  |  |  |  |  |  |  |  |  | 2.2 | 1.5 | 5 | 4.0 |
| 2a | 1T | 31 | 1.65 | 1.65 | 1 | 120 | 114 | 120 | 0.3 | 0.3 | 0.19 | 0.19 | 70 | 117 | 145 | 28 | 2.1 | 3.4 | 5 | 4.0 |
|  | 1B |  | 1.65 | 1.65 | 2 | 115 | 110 | 115 | 1 | 1 | 0.19 | 0.19 | 70 | 118 | 149 | 31 | 2.1 | 2.9 | 5 | 4.0 |
|  | 2T |  | 1.65 | 1.65 | 1 |  |  |  |  |  |  |  |  |  |  |  | 2.3 | 4.9 | 5 | 4.0 |
|  | 2B |  | 1.65 | 1.65 | 2 |  |  |  |  |  |  |  |  |  |  |  | 2.3 | 3.1 | 5 | 4.0 |
| 2b | 1T | 31 | 1.65 | 1.65 | 1 | 119 | 114 | 120 | 0.3 | 0.3 | 0.19 | 0.19 | 70 | 117 | 145 | 28 | 2.1 | 3.4 | 5 | 4.0 |
|  | 1B |  | 1.65 | 1.65 | 2 |  |  |  | 1 | 1 | 0.19 | 0.19 | 70 | 117 | 148 | 31 | 2.0 | 3.8 | 5 | 5.0 |
|  | 2T |  |  |  |  |  |  |  |  |  |  |  |  |  |  |  | 2.2 | 4.4 | 5 | 4.0 |
|  | 2B |  |  |  |  |  |  |  |  |  |  |  |  |  |  |  | 2.3 | 2.3 | 5 | 5.0 |
| 3a | 1T | Angled Substrates: ~20° WD 24–31 cm | 1.65 | 1.65 | 1 | 115 | 110 | 115 | 0.3 | 0.3 | 0.19 | 0.19 | 70 | 115 | 170 | 55 | 2.3 | 10.1 | 5 | 5.0 |
|  | 1B |  | 1.65 | 1.65 | 2 |  |  |  | 1 | 1 | 0.19 | 0.19 | 70 | 122 | 172 | 50 | 2.1 | 5.0 | 5 | 5.0 |
|  | 2T |  |  |  |  |  |  |  |  |  |  |  |  |  |  |  | 2.1 | 4.3 | 5 | 5.0 |
|  | 2B |  |  |  |  |  |  |  |  |  |  |  |  |  |  |  | 2.0 | 4.0 | 5 | 4.0 |
|  | 1T-top |  |  |  |  |  |  |  |  |  |  |  |  |  |  |  | 2.4 |  |  |  |
|  | 1C |  |  |  |  |  |  |  |  |  |  |  |  |  |  |  | 2.1 |  |  |  |
|  | 1B-bot |  |  |  |  |  |  |  |  |  |  |  |  |  |  |  | 2.2 |  |  |  |
|  | 2T-top |  |  |  |  |  |  |  |  |  |  |  |  |  |  |  | 2.2 |  |  |  |
|  | 2C |  |  |  |  |  |  |  |  |  |  |  |  |  |  |  | 2.0 |  |  |  |
|  | 2B-bot |  |  |  |  |  |  |  |  |  |  |  |  |  |  |  | 2.2 |  |  |  |
| 4 | 1T | 31 | 1.65 | 1.65 | 1 | 125 | 120 | 125 | 0.3 | 0.3 | 0.19 | 0.19 | 70 | 121 | 151 | 30 | 3.8 | 2.4 | 5 | 5.0 |
|  | 1B |  | 2.5 | 2.5 | 2 |  |  |  | 1 | 1 | 0.19 | 0.19 | 70 | 118 | 152 | 34 | 3.7 | 3.1 | 5 | 4.0 |
|  | 2T |  | 2.5 | 2.5 | 3 |  |  |  | 1 | 1 | 0.19 | 0.19 | 70 | 125 | 155 | 30 | 4.0 | 3.1 | 5 | 2.0 |
|  | 2B |  | 2.5 | 2.5 |  |  |  |  | 1 | 1 | 0.19 | 0.19 | 70 | 125 | 156 | 31 | 4.0 | 2.4 | 5 | 2.0 |
| 5a | 1T | 31 | 1.65 | 1.65 | 1 | 75 | 70 | 75 | 0.3 | 0.3 | 0.19 | 0.19 | 70 | 73 | 108 | 35 | 4.4 | 1.9 | 5 | 3/4 |
|  | 1B |  | 2.5 | 2.5 | 2 |  |  |  | 2 | 2 | 0.19 | 0.19 | 70 | 79 | 123 | 44 | 4.3 | 0.9 | 5 | 4.0 |
|  | 2T |  | 2.5 | 2.5 | 3 |  |  |  | 2 | 2 | 0.19 | 0.19 | 70 | 89 | 129 | 40 | 4.6 | 1.0 | 5 | 4.0 |
|  | 2B |  | 2.5 | 2.5 |  |  |  |  | 2 | 2 | 0.19 | 0.19 | 70 | 99 | 135 | 36 | 4.6 | 0.8 | 5 | 4.0 |
| 5b | 1T | 20 | 1.65 | 1.65 | 1 | 75 | 70 | 75 | 0.3 | 0.3 | 0.19 | 0.19 | 70 | 70 | 112 | 42 | 4.3 | 1.0 | 5 | 3.0 |
|  | 1B |  | 2.5 | 2.5 | 2 |  |  |  | 2 | 2 | 0.19 | 0.19 | 70 | 82 | 129 | 47 | 4.3 | 1.0 | 5 | 3.0 |
|  | 2T |  | 2.5 | 2.5 | 3 |  |  |  | 2 | 2 | 0.19 | 0.19 | 70 | 87 | 134 | 47 | 5.1 | 1.0 | 5 | 4.0 |
|  | 2B |  | 2.5 | 2.5 | 4 |  |  |  | 2 | 2 | 0.19 | 0.19 | 70 | 90 | 138 | 48 | 5.2 | 1.3 | 5 | 3.0 |

TABLE 1-continued

| ex # | Pos | working distance (cm) | Ar(slm) arc1 | Ar(slm) arc2 | ABL | PH Setpoint (°C) A | B | C | O₂(slm) arc1 | arc2 | D4(slm) arc1 | arc2 | Current amps | T$_{initial}$ Avg. (°C) | T$_{max}$ (°C) | ΔT (°C) | Thickness (μm) | Δ Taber Haze (%) | Initial Adhesion | WS Adhesion |
|---|---|---|---|---|---|---|---|---|---|---|---|---|---|---|---|---|---|---|---|---|
| 5c | 1T | 25.5 | 1.65 | 1.65 | 1 | 75 | 70 | 75 | 0.3 | 0.3 | 0.19 | 0.19 | 70 | 71 | 126 | 55 | 4.6 | 1.5 | 5 | 3.5 |
|  | 1B |  | 2.5 | 2.5 | 2 |  |  |  | 2 | 2 | 0.19 | 0.19 | 70 | 81 | 147 | 66 | 4.9 | 0.7 | 5 | 4.0 |
|  | 2T |  | 2.5 | 2.5 | 3 |  |  |  | 2 | 2 | 0.19 | 0.19 | 70 | 91 | 153 | 62 | 6.0 | 1.4 | 5 | 4.0 |
|  | 2B |  | 2.5 | 2.5 | 4 |  |  |  | 2 | 2 | 0.19 | 0.19 | 70 | 104 | 160 | 56 | 6.1 | 1.2 | 5 | 4.0 |
| 6 | 12aT | Angled Substrates: 20° | 1.65 | 1.65 | 1 | 55 | 50 | 55 | 0.3 | 0.3 | 0.19 | 0.19 | 70 |  |  |  | 4.8 | 1.5 | 5 | 4.0 |
|  | 12aB | 29 cm --> 19 cm WD | 2.5 | 2.5 | 2 |  |  |  | 2 | 2 | 0.19 | 0.19 | 70 |  |  |  | 4.6 | 2.0 | 5 | 4.0 |
|  | 12BT |  | 2.5 | 2.5 | 3 |  |  |  | 2 | 2 | 0.19 | 0.19 | 70 |  |  |  | 4.7 | 1.4 | 5 | 4.0 |
|  | 12BB |  | 2.5 | 2.5 | 4 |  |  |  | 2 | 2 | 0.19 | 0.19 | 70 |  |  |  | 4.9 | 1.8 | 5 | 4.0 |
|  | 12dF | plus 90 deg samples |  |  |  |  |  |  |  |  |  |  |  |  |  |  | 2.4 | 2.9 | 4 | 4.0 |
|  | 12dR |  |  |  |  |  |  |  |  |  |  |  |  |  |  |  | 3.4 | 4.4 | 4 | 4.0 |
|  | 12cF |  |  |  |  |  |  |  |  |  |  |  |  |  |  |  | 3.3 | 2.2 | 5 | 4.0 |
|  | 12cR |  |  |  |  |  |  |  |  |  |  |  |  |  |  |  | 2.8 | 2.6 | 5 | 5.0 |
| 7a | 12i | Angled Substrates: 60, 50° | 1.65 | 1.65 | 1 | 75 | 70 | 75 | 0.3 | 0.3 | 0.19 | 0.19 | 70 |  |  |  | 4.7 | 3.6 | 5 | 4.0 |
|  | 12f | 27.8 cm --> 19.8 cm WD | 2.5 | 2.5 | 2 |  |  |  | 2 | 2 | 0.19 | 0.19 | 70 |  |  |  | 3.8 | 3.4 | 5 | 4.0 |
|  | 12e |  | 2.5 | 2.5 | 3 |  |  |  | 2 | 2 | 0.19 | 0.19 | 70 |  |  |  | 3.8 | 8.9 | 5 | 4.0 |
|  | 12j |  | 2.5 | 2.5 | 4 |  |  |  | 2 | 2 | 0.19 | 0.19 | 70 |  |  |  | 4.9 | 3.7 | 5 | 4.0 |
|  | 12g |  |  |  |  |  |  |  |  |  |  |  |  |  |  |  | 5.3 | 2.3 | 5 | 3.5 |
|  |  |  |  |  |  |  |  |  |  |  |  |  |  |  |  |  | 3.9 | 8.0 | 5 | 5.0 |
| 7b | 12i | 2.5Ar, 2Ox, 70A, 75C | 1.65 | 1.65 | 1 | 75 | 70 | 75 | 0.3 | 0.3 | 0.19 | 0.19 | 70 |  |  |  | 5.0 | 2.8 | 5 | 4.0 |
|  | 12f | Angled Substrates: 50, 60° | 2.5 | 2.5 | 2 |  |  |  | 2 | 2 | 0.19 | 0.19 | 70 |  |  |  | 4.7 | 1.5 | 4 | 1.0 |
|  | 12e | 27.8 cm --> 19.8 cm WD | 2.5 | 2.5 | 3 |  |  |  | 2 | 2 | 0.19 | 0.19 | 70 |  |  |  | 3.5 | 7.4 | 5 | 0.0 |
|  | 12j | repeat of M1492, w/50 deg | 2.5 | 2.5 | 4 |  |  |  | 2 | 2 | 0.19 | 0.19 | 70 |  |  |  | 4.7 | 2.2 | 5 | 4.0 |
|  | 12h | in front of arc 1 and 60 deg |  |  |  |  |  |  |  |  |  |  |  |  |  |  | 5.0 | 2.5 | 4 | 1.0 |
|  | 12g | in front of arc 2 this time |  |  |  |  |  |  |  |  |  |  |  |  |  |  | 4.3 | 7.6 | 5 | 0.0 |

What is claimed is:

1. A process for coating a non-planar substrate defining a working distance variation in the range of 6 cm to 16 cm, comprising:

generating a plasma from one or more stationary expanding thermal plasma sources;

injecting a first set of vaporized reagents into the plasma to form a first coating on the substrate; and injecting a second set of vaporized reagents into the plasma to form one or more coatings over the first coating, the plasma having an Ar flow and arc current that determine the total ion flux that provides substantially uniform properties at various working distances from the expanding thermal plasma source to the substrate, the total ion flux being calculated based on an uncorrected ion flux determined as a function of radial distance across the plasma at a given working distance from the plasma source and fitting the data to a Gaussian distribution, the area under the Gaussian distribution and the width determining the total ion flux.

2. The process of claim 1 wherein the uniform coating property is the coating thickness.

3. The process of claim 1 wherein the uniform coating property is the abrasion resistance of the coating.

4. The process of claim 1 wherein the abrasion resistant coating is a plasma polymerized organosilicon.

5. The process of claim 4 wherein the organosilicon is selected from the group consisting of octamethylcyclotetrasiloxane, decamethylcyclopentasiloxane, hexamethyldisiloxane, tetramethyldisiloxane, tetramethyltetravinylcyclotetrasiloxane, vinyltrimethylsilane and dimethyldimethoxysilane.

6. The process of claim 1 wherein the abrasion resistant coating is deposited as two or more layers.

7. The process of claim 6 wherein the first layer has an oxygen content that is lower than the oxygen content of the other layers.

8. The process of claim 7 wherein the layers other than the first layer have the same composition.

9. The process of claim 1 further comprising a plastic substrate and one or more functional layers deposited between the substrate and the abrasion resistant coating.

10. The process of claim 9 wherein the hardness and thickness of the abrasion resistant layer is adjusted based on the hardness of the underlying coatings.

11. The process of claim 9 wherein a functional layer is a silicone hardcoat with organic UV absorbers.

12. The process of claim 11 further comprising a primer layer between the silicone hardcoat and the plastic substrate.

13. The process of claim 9 wherein the functional coating includes inorganic UV filters, IR coatings, AR coatings, TOOs, barrier coatings, and combined multi layers.

14. The process of claim 1 wherein an uncorrected ion flux is measured as a function of radial distance across the plasma at a given working distance from the substrate.

15. The process of claim 14 wherein data associated with the measured uncorrected ion flux is fitted to a Gaussian distribution, the area under the Gaussian distribution and the width providing the ion flux.

16. The process of claim 1 wherein the steps of generating the plasma and injecting the vaporized reagents are done with an Ar flow at 1.65-2.5 slm, an $O_2$ flow at 0.3-1 slm, an octamethylcyclotetrasiloxane flow at up to 0.19 slm, and an arc current of up to 70 amps.

* * * * *

UNITED STATES PATENT AND TRADEMARK OFFICE
CERTIFICATE OF CORRECTION

PATENT NO. : 7,390,573 B2  Page 1 of 1
APPLICATION NO. : 11/075341
DATED : June 24, 2008
INVENTOR(S) : Bastian A. Korevaar et al.

It is certified that error appears in the above-identified patent and that said Letters Patent is hereby corrected as shown below:

In column 16, in claim 13, line 3, before "barrier coatings," delete "TOOs," and substitute --TCOs,-- in its place.

In column 16, in claim 16, line 3, after "an Ar flow at" delete "1 .65-2.5" and substitute --1.65-2.5-- in its place.

Signed and Sealed this

Third Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,390,573 B2
APPLICATION NO. : 11/075341
DATED : June 24, 2008
INVENTOR(S) : Bastian A. Korevaar et al.

Page 1 of 1

It is certified that error appears in the above-identified patent and that said Letters Patent is hereby corrected as shown below:

In column 16, in claim 13, line 20, before "barrier coatings," delete "TOOs," and substitute --TCOs,-- in its place.

In column 16, in claim 16, line 30, after "an Ar flow at" delete "1 .65-2.5" and substitute --1.65-2.5-- in its place.

This certificate supersedes the Certificate of Correction issued March 3, 2009.

Signed and Sealed this

Thirty-first Day of March, 2009

JOHN DOLL
*Acting Director of the United States Patent and Trademark Office*